US011261536B2

(12) United States Patent
Ecker et al.

(10) Patent No.: US 11,261,536 B2
(45) Date of Patent: Mar. 1, 2022

(54) PRODUCTION METHOD AND GROWTH ARRANGEMENT FOR PRODUCING A BULK SIC SINGLE CRYSTAL BY ARRANGING AT LEAST TWO INSULATION CYLINDER COMPONENTS TO CONTROL A VARIATION IN A VOLUME ELEMENT DENSITY

(71) Applicant: SI CRYSTAL GMBH, Nuremberg (DE)

(72) Inventors: Bernhard Ecker, Nuremberg (DE); Ralf Mueller, Zirndorf (DE); Matthias Stockmeier, Egloffstein (DE); Michael Vogel, Nuremberg (DE); Arnd-Dietrich Weber, Forchheim (DE)

(73) Assignee: SiCrystal GmbH, Nuremberg (DE)

( * ) Notice: Subject to any disclaimer, the term of this patent is extended or adjusted under 35 U.S.C. 154(b) by 191 days.

(21) Appl. No.: 16/791,028

(22) Filed: Feb. 14, 2020

(65) Prior Publication Data

US 2020/0263318 A1 Aug. 20, 2020

(30) Foreign Application Priority Data

Feb. 20, 2019 (EP) .................................... 19158315

(51) Int. Cl.
*C30B 23/06* (2006.01)
*C23C 14/06* (2006.01)
(Continued)

(52) U.S. Cl.
CPC .......... *C30B 23/06* (2013.01); *C23C 14/0635* (2013.01); *C23C 14/243* (2013.01); *C30B 29/36* (2013.01)

(58) Field of Classification Search
CPC ....... C30B 23/00; C30B 23/002; C30B 23/02; C30B 23/06; C30B 29/00; C30B 29/10;
(Continued)

(56) References Cited

U.S. PATENT DOCUMENTS

| 8,865,324 B2 | 10/2014 | Straubinger et al. |
| 2010/0175614 A1 | 7/2010 | Straubinger |

FOREIGN PATENT DOCUMENTS

| CN | 105442038 A | 3/2016 |
| CN | 105568370 A | 5/2016 |

(Continued)

OTHER PUBLICATIONS

Mersen product literature entitled "CALCARB Rigid Carbon Thermal Insulation Technical Guide," pp. 1-8, published Feb. 7, 2017, available at https://www.mersen.co.uk/sites/uk/files/publications-media/3-gs-calcarb-rigid-carbon-thermal-insulation-mersen.pdf (Year: 2017).*

(Continued)

*Primary Examiner* — Kenneth A Bratland, Jr.
(74) *Attorney, Agent, or Firm* — Laurence A. Greenberg; Werner H. Stemer; Ralph E. Locher

(57) ABSTRACT

A bulk SiC single crystal is produced by placing an SiC seed crystal in a crystal growth region of a growth crucible, and introducing SiC source material into an SiC reservoir region, and the bulk SiC single crystal is grown on from an SiC growth gas phase by deposition. The growth crucible is surrounded by an insulation that extends rotationally symmetrically and axially towards the central middle longitudinal axis. The insulation has mutually concentric insulation cylinder components and the insulation is notionally divided into insulation ring segments that are in turn notionally divided into volume elements. The insulation cylinder components are selected and positioned relative to one another such that every volume element of the insulation ring segment in question has a volume element density varying by not more than 10% from an average insulation ring segment density of the insulation ring segment in question.

21 Claims, 4 Drawing Sheets

(51) Int. Cl.
*C23C 14/24* (2006.01)
*C30B 29/36* (2006.01)

(58) Field of Classification Search
CPC ....... C30B 29/36; C30B 35/00; C30B 35/002; C23C 14/0635; C23C 14/243
USPC ....... 117/84–85, 88, 94, 100, 106, 109, 200, 117/204, 900, 937, 951
See application file for complete search history.

(56) References Cited

FOREIGN PATENT DOCUMENTS

| | | | |
|---|---|---|---|
| CN | 107779955 A | | 3/2018 |
| CN | 108130593 A | | 6/2018 |
| JP | 2008110907 A | * | 5/2008 |
| JP | 2008110907 A | | 5/2008 |

OTHER PUBLICATIONS

Mersen France, "CALCARB Rigid Carbon Thermal Insulation Technical Guide", Feb. 7, 2017, pp. 1-8, URL: https://www.graphite-eng.com/uploads/downloads/calcarb_brochure.pdf.

* cited by examiner

PRODUCTION METHOD AND GROWTH ARRANGEMENT FOR PRODUCING A BULK SIC SINGLE CRYSTAL BY ARRANGING AT LEAST TWO INSULATION CYLINDER COMPONENTS TO CONTROL A VARIATION IN A VOLUME ELEMENT DENSITY

CROSS-REFERENCE TO RELATED APPLICATION

This application claims the priority, under 35 U.S.C. 119, of European patent application EP 19 158 315, filed Feb. 20, 2019; the prior application is herein incorporated in its entirety.

BACKGROUND OF THE INVENTION

Field of the Invention

The invention relates to a method of producing at least one bulk SiC single crystal by means of sublimation growth, and to a growth arrangement for production of a bulk SiC single crystal.

The uses of semiconductor material silicon carbide (SiC), owing to its outstanding physical, chemical, electrical and optical properties, also include uses as a starting material for high-performance semiconductor components, for high-frequency components and for special light-emitting semiconductor components. For these components, SiC substrates (=SiC wafers) with maximum substrate diameter and maximum quality are required.

The SiC substrates are based on high-quality bulk SiC single crystals, which are generally produced by means of physical gas phase deposition (PVT), especially by means of a (sublimation) method described, for example, in U.S. Pat. No. 8,865,324 B2. Monocrystalline SiC substrates in wafer form are cut out of these bulk SiC single crystals and, after their surface has been processed in multiple stages, especially by means of multiple polishing steps, are provided in the course of component manufacture with at least one monocrystalline epitaxial layer, for example of SiC or GaN (gallium nitride). The properties of this epitaxial layer and hence ultimately also of the components produced therefrom depend to a crucial degree on the quality of the SiC substrate or the underlying bulk SiC single crystal.

For an optimal yield, crystal defects (for example edge defects=modification faults, local increases in dislocation, etc.) that can arise during crystal growth as a result of variances from the ideal crystal form should be very substantially avoided. In addition, the production of bulk SiC single crystals by the PVT process is very costly and time-consuming. Material which is unusable for further use for component production, for example owing to a crystal structure which is asymmetric for thermal reasons, therefore leads to significantly reduced yields and elevated costs.

In the production of bulk SiC single crystals, a growth crucible made of graphite or a refractory element is typically heated up by means of induction heating or resistance heating. Within the growth crucible, SiC source material is sublimed and deposited on an SiC seed crystal. Owing to the rotational symmetry of the bulk SiC single crystal thus grown, it is possible to use rotationally symmetric growth arrangements.

However, there are various influencing parameters that have an effect on a variance in the thermal field and hence on a variance in the crystal geometry from ideal rotational symmetry. For example, the heater used may not have ideal rotational symmetry. More particularly, electrical connections, holders and the like can lead to slight variances from rotational symmetry.

Chinese patent applications CN 105442038 A and CN 105568370 A describe production methods and growth arrangements in which the growth crucible is rotated continuously within the heating unit and the thermal insulation during the crystal growth. In this way, it is possible to average out effects on the growing bulk SiC single crystal that result from imperfect rotational symmetry of the heating unit over the course of the growing time. However, shaking caused by the rotating motion of the growth crucible can lead to crystal defects, for example to inclusions of carbon from the wall material. Moreover, local temperature variations that are caused by the rotation in a rotationally asymmetric temperature field have an adverse effect on crystal quality, especially on dislocation density.

BRIEF SUMMARY OF THE INVENTION

The problem addressed by the invention is therefore that of specifying a production process and a growth arrangement of the type specified at the outset, in such a way that it is thus possible to produce a better bulk SiC single crystal.

With the above and other objects in view there is provided, in accordance with the invention, a method of producing a bulk SiC single crystal by sublimation growth, the method comprising:

a) prior to a commencement of a growing process, placing at least one SiC seed crystal in a crystal growth region of a growth crucible, and introducing SiC source material into a SiC reservoir region of the growth crucible, b) during the growing process, generating an SiC growth gas phase in the crystal growth region by sublimation of the SiC source material and by transporting sublimed gaseous components into the crystal growth region, and growing the bulk SiC single crystal having a central middle longitudinal axis onto the SiC seed crystal by deposition from an SiC growth gas phase;

wherein:

c) the growth crucible, prior to commencement of the growing process, is surrounded by an insulation that extends in a rotationally symmetric manner and axially in a direction of a central middle longitudinal axis and that has at least two insulation cylinder components; and wherein:

c1) the at least two insulation cylinder components are in a mutually concentric arrangement with one inside another, and each of the at least two insulation cylinder components has a wall thickness measured in a radial direction;

c2) the insulation is notionally divided into multiple insulation ring segments arranged successively and axially in the direction of the central middle longitudinal axis;

c3) each of the insulation ring segments is in turn notionally divided into multiple volume elements arranged alongside one another in a tangential direction;

c4) each of the insulation ring segments has an average insulation ring segment density measured over respective wall thicknesses of all of the at least two insulation cylinder components; and c5) the at least two insulation cylinder components, each of which have variances in density in sub-regions, are selected and positioned relative to one another in such a way that every volume element of the insulation ring segment in question has a volume element density varying by not more than 10% from the average insulation ring segment density of the insulation ring segment in question; and c6) every volume element extends in axial direction over an axial element length which is equal to an axial segment length of the insulation ring segment and is up to 50 mm, in circumferential direction over an outer tangential element length of up to 50 mm, and in radial direction over a sum of all wall thicknesses of the at least two insulation cylinder components.

In other words, for solution of the problem relating to the method, there is specified a method of producing at least one bulk SiC single crystal by means of sublimation growth. In the method according to the invention, prior to the commencement of growing, at least one SiC seed crystal is disposed in at least one crystal growth region of a growth crucible, and SiC source material, especially in pulverulent form, is introduced into at least one SiC reservoir region of the growth crucible. During the growing, an SiC growth gas phase is generated in the at least one crystal growth region by means of sublimation of the SiC source material and by means of transport of the sublimed gaseous components into the at least one crystal growth region, and the at least one bulk SiC single crystal having a central middle longitudinal axis is grown onto the at least one SiC seed crystal by means of deposition from the SiC growth gas phase. The growth crucible, prior to commencement of growing, is surrounded by an insulation, especially thermal insulation, that extends in a rotationally symmetric manner and axially in the direction of the central middle longitudinal axis and has at least two insulation cylinder components. The at least two insulation cylinder components are in a mutually concentric arrangement with one inside the other, and each of the at least two insulation cylinder components has a wall thickness measured in a radial direction. The insulation is notionally divided into multiple insulation ring segments arranged successively and axially in the direction of the central middle longitudinal axis. Each of these insulation ring segments is in turn notionally divided into multiple volume elements arranged alongside one another in a tangential direction, and each has an average insulation ring segment density measured over the wall thicknesses of all of the at least two insulation cylinder components. The at least two insulation cylinder components, each of which have variances in density in sub-regions, are selected and positioned relative to one another in such a way that every volume element of the insulation ring segment in question has a volume element density varying by not more than 10% from the average insulation ring segment density of the insulation ring segment in question, wherein every volume element extends in axial direction over an axial element length which is equal to an axial segment length of the insulation ring segment and is up to 50 mm, in circumferential direction over an outer tangential element length of up to 50 mm, and in radial direction over the addition of all wall thicknesses of the at least two insulation cylinder components.

All directions here are based on the central middle longitudinal axis. Thus, the axial direction is especially the direction along the central middle longitudinal axis, and the radial direction is especially any direction oriented perpendicular to the central middle longitudinal axis. In addition, the peripheral direction (=tangential direction) is especially understood to mean that around the central middle longitudinal axis. The outer tangential element length of the volume elements is measured in the radial position on the outside of the outermost insulation cylinder component, i.e. more particularly at the outer circumferential surface of the insulation cylinder component furthest removed radially from the central middle longitudinal axis. For the outer tangential element length and also for the axial element length of the volume elements, the lower limit in each case is especially 10 mm, preferred values in each case being 20 mm, 30 mm, 40 mm or 50 mm.

Preferably, each insulation ring segment has a different axial distance from the axially lower or upper edge of the insulation. More particularly, all volume elements of all insulation ring segments are at least essentially of the same size.

In ascertaining the average insulation ring segment density, more particularly, only regions in which the insulation material from one of the at least two insulation cylinder components is present are included in radial direction, in which the wall thicknesses of the at least two insulation cylinder components are measured. By contrast, any interstitial spaces between adjacent insulation cylinder components are preferably neglected. During the growing, there are only few gas atoms in any case in such an interstitial space owing to low growing pressure of, for example, between about 1 hPa (=mbar) and about 100 hPa (=mbar). The gas atmosphere that exists outside the growth crucible is composed, for example, essentially of at least one noble gas, for example argon (Ar), and of nitrogen (N). These few gas atoms can be neglected in the assessment of density. Compared to the distinctly denser insulation material of the at least two insulation cylinder components, they are negligible.

It has been recognized in accordance with the invention that, apart from the components that determine the energy input into the growth arrangement, i.e. more particularly the induction coil(s) and/or heating elements of an inductive heating device or a resistance heater, the insulation that keeps the thermal energy within the growth arrangement or crucially determines the energy output from the growth arrangement also has a crucial influence on the rotational symmetry of the growing bulk SiC single crystal. For example, slight local differences in density of the (thermal) insulation can lead to an asymmetric heat output and hence to a bulk SiC single crystal not having ideal rotational symmetry. In the temperature region of especially above 2000° C., in which bulk SiC single crystals are produced, the heat is transferred mainly via radiation, and therefore the density of the insulation material of the (thermal) insulation correlates directly with heat transfer.

Therefore, advantageously, a rotationally symmetric temperature field is established by controlled adjustment of the insulation properties to the prevailing conditions, in order thus to produce bulk SiC single crystals of maximum perfection of rotational symmetry by the method.

On account of their production process, (thermal) insulations that are used in the method of producing bulk SiC single crystals, even as supplied, have different material properties within the cylinder geometry of an insulation cylinder component, but also from insulation cylinder component to insulation cylinder component. For instance, the density of the insulation may especially be affected by variations. Such material variations have a direct effect on thermal conductivity, and hence on the homogeneity of the removal of heat in the crystal growing process and hence also on the rotational symmetry of the growing bulk SiC single crystal.

An additional factor is that a (thermal) insulation, for reasons of cost, is especially used repeatedly for the production of bulk SiC single crystals. Owing to the severe stresses resulting from very high temperatures of more than 2000° C. and also by virtue of the silicon (Si)-containing gas phase, there is a change in the insulation properties over the course of time. For instance, the Si-containing gas phase components that escape from the growth crucible react with the insulation material, especially carbon, in the insulation to give SiC, which is incorporated into the insulation and hence affects the insulation properties. More particularly, the incorporated SiC locally increases the density of the insulation material, as a result of which there is a fall in the thermal insulation effect at this site and the growth crucible here has a lower temperature than in the rest of the region.

The effect of the insulation density on the rotational symmetry of the growing bulk SiC single crystal is elucidated in detail using a few case studies.

For instance, a local increase in density of the insulation in the region of the crystal growth region leads to a lower thermal insulation effect there, associated with a reduction in temperature in this part of the growth interface and, as a result, a local increase in growth rate. The growing bulk SiC single crystal here is longer than at other points. This is because the growth rate, at constant temperature, is determined mainly by the axial temperature gradient. A local difference in density of the insulation leads to a locally different axial temperature gradient and hence to a different local growth rate.

Conversely, a local reduction in density of the insulation in the region of the crystal growth region leads to a higher thermal insulation effect there, associated with an increase in temperature in this part of the growth interface and, as a result, a local reduction in growth rate. The growing bulk SiC single crystal here is shorter than at other points.

A local increase in density of the insulation in the region of the SiC reservoir region leads to a lower thermal insulation effect there, associated with a fall in the sublimation rate in this sub-region and, as a result, a local reduction in growth rate above this point. The growing bulk SiC single crystal is shorter here than at other points.

Conversely, a local reduction in density of the insulation in the region of the SiC reservoir region leads to a higher thermal insulation effect there, associated with a rise in the sublimation rate in this sub-region and, as a result, a local increase in growth rate above this point. The growing bulk SiC single crystal here is longer than at other points.

In each of the four cases, the result is a bulk SiC single crystal having a variance from the actually desired perfect rotational symmetry, resulting in a drop in quality and yield.

In order to avoid such adverse effects on the rotational symmetry of the temperature field and also of the growing bulk SiC single crystal, the insulation properties are balanced out. This advantageous balancing is effected by the division of the (thermal) insulation into multiple (at least two) insulation cylinder components, which are also especially selected specifically according to their insulation properties and are then especially also positioned relative to one another with controlled alternating alignment. A measure used here is the density, especially the volume element density. In the case of appropriately selected insulation cylinder components positioned relative to one another, the latter preferably does not vary by more than 10% of the average insulation ring segment density of the insulation ring segment in question in any volume element. As a result, for the insulation formed in multiple parts from sub-components (=insulation cylinder components) each with incompletely rotationally symmetric insulation characteristics, overall insulation characteristics having a high level of, if not perfect, rotational symmetry better than for each of the sub-components (=insulation cylinder components) are achieved. The result is a temperature field likewise of virtually ideal rotational symmetry.

It is thus possible to produce rotationally symmetric bulk SiC single crystals in high quality. The loss of material that has occurred to date in subsequent further processing owing to any asymmetry of the bulk SiC single crystals is significantly reduced in this way.

The more insulation cylinder components the insulation contains, the better the compensation for variances in density in sub-regions of the insulation cylinder components. On the other hand, the costs also rise with every additional insulation cylinder component. Therefore, a technically and economically viable upper limit on the number of insulation cylinder components is especially five. The insulation may thus especially have two, three, four or five insulation cylinder components. A very good compromise with regard to compensation for variances in density in the insulation cylinder components which is desirable from a technical point of view and a reduction in costs which is desirable from an economic point of view is insulation that preferably has three insulation cylinder components.

It is especially possible by the method of the invention to produce one bulk SiC single crystal or two bulk SiC single crystals. For every growth crucible and growing run, it is thus preferably possible to produce up to two bulk SiC single crystals.

In addition, the growth crucible may especially be heated inductively by means of at least one heating coil or resistively by means of a resistance heater.

An advantageous configuration is one in which an insulation material having a material density between 0.05 g/cm$^3$ and 0.5 g/cm$^3$, especially between 0.1 g/cm$^3$ and 0.2 g/cm$^3$, is chosen for the insulation. An insulation material of particularly good suitability is especially carbon-based. It is also possible to use pure carbon, for example in the form of graphite or graphite-like carbon. Preferably, such a carbon-based insulation material is composed of long fibres or short fibres. Rotationally symmetric short fibre insulations are converted to the final form, for example, by carbonization of mixtures of carbon fibres and phenolic resin, by subsequent thermal treatment(s) and by mechanical processing. Overall, such insulation materials achieve very good thermal insulation of the growth crucible.

In a further advantageous configuration, prior to commencement of growing, a determination of density is performed by means of an x-ray method on the at least two insulation cylinder components. More particularly, by means of this x-ray method, a density distribution within each of the at least two insulation cylinder components is determined. Preferably, the insulation, after it has been assembled from the individual insulation cylinder components, can finally be subjected once again to such an x-ray analysis in order to verify whether the overall structure of the insulation has the desired rotationally symmetric density distribution. It is likewise possible to conduct such an x-ray analysis prior to a reuse of an insulation. Using the x-ray analysis method, it is possible to find information in very good detail as to the local distribution of the density in the insulation cylinder components and also of the insulation overall.

In a further advantageous configuration, the at least two insulation cylinder components are selected and positioned relative to one another such that each volume element of the insulation ring segment in question has a volume element density varying by not more than 5% from the average insulation ring segment density of the insulation ring segment in question. This results in an even higher efficiency of rotational symmetry of the density distribution in the insulation cylinder components and, as a result, of the temperature field in the growth crucible.

The latter is also applicable to a further advantageous configuration, according to which the respective insulation ring segment and the volume elements of this insulation ring segment are chosen such that the axial element length of the volume elements is 20 mm and the outer tangential element length of the volume elements is 20 mm. As the axial and/or outer tangential element length falls, there is an increase in the homogeneity of the insulation, which has a positive effect on the rotational symmetry of the growing bulk SiC single crystal.

In a further favorable configuration, the at least two insulation cylinder components are chosen such that their radial wall thickness is in each case in the range between 5 mm and 50 mm, especially between 10 mm and 20 mm. These wall thicknesses achieve very good thermal insulation of the growth crucible. Moreover, these minimize the mechanical stress on the insulation as a result of the thermal stresses that occur in the growth crucible at the high growing temperatures of up to more than 2000° C. On the outside, the temperature within a water cooling system present by way of example is close to room temperature, which is typically about 25° C. There is thus a very significant temperature gradient in a very small space, which can lead to the thermal stresses addressed.

In a further favorable configuration, the at least two insulation cylinder components are chosen such that a quotient of two, especially any two, of the radial wall thicknesses is in the range between 0.5 and 2. The radial wall thicknesses may thus, for example, be equal, but may also vary from one another to a certain degree, namely by a factor of up to 2. This also serves to reduce the mechanical stress on the insulation as a result of the thermal stresses.

In a further favorable configuration, the insulation is constructed in such a way that two mutually adjacent insulation cylinder components among the at least two insulation cylinder components each have a radial separation in the range between 0.1 mm and 5 mm, especially between 1 mm and 2 mm. This radial gap between adjacent insulation cylinder components facilitates the inserting of one of the insulation cylinder components into the other during assembly. Moreover, mechanical tensions on the insulation owing to thermal expansions during growing operation are thus avoided.

With the above and other objects in view there is also provided, in accordance with the invention, a novel growth arrangement. The growth arrangement according to the invention for the production of at least one bulk SiC single crystal by means of sublimation growth has a growth crucible having at least one crystal growth region, each intended to accommodate an SiC seed crystal, and has at least one SiC reservoir region intended to accommodate SiC source material, especially pulverulent SiC source material, and a heating device for heating the growth crucible, such that, during the growth, sublimation of the SiC source material, transport of the sublimed gaseous components into the at least one crystal growth region and generation of an SiC growth gas phase thereon takes place, as a result of which the at least one bulk SiC single crystal having a central middle longitudinal axis is grown onto the at least one SiC seed crystal by means of deposition from the SiC growth gas phase. The growth crucible is surrounded by an insulation, especially thermal insulation, that extends in a rotationally symmetric manner and axially in the direction of the central middle longitudinal axis and has at least two insulation cylinder components, wherein the at least two insulation cylinder components are in a mutually concentric arrangement with one inside the other, and each of the at least two insulation cylinder components has a wall thickness measured in a radial direction. The insulation is notionally divided into multiple insulation ring segments arranged successively and axially in the direction of the central middle longitudinal axis, and each of these insulation ring segments is in turn notionally divided into multiple volume elements arranged alongside one another in a tangential direction. Each of these insulation ring segments has an average insulation ring segment density measured over the wall thicknesses of all of the at least two insulation cylinder components. The at least two insulation cylinder components, each of which have variations in density in subregions, are selected and positioned relative to one another in such a way that every volume element of the insulation ring segment in question has a volume element density varying by not more than 10% from the average insulation ring segment density of the insulation ring segment in question, wherein every volume element extends in axial direction over an axial element length which is equal to an axial segment length of the insulation ring segment and is up to 50 mm, in circumferential direction over an outer tangential element length of up to 50 mm, and in radial direction over the addition of all wall thicknesses of the at least two insulation cylinder components.

The growth arrangement according to the invention and its favorable configurations have essentially the same advantages that have already been described in connection with the method according to the invention and its configurations.

Other features which are considered as characteristic for the invention are set forth in the appended claims.

Although the invention is illustrated and described herein as embodied in a production method for a bulk SiC single crystal and growth arrangement therefor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
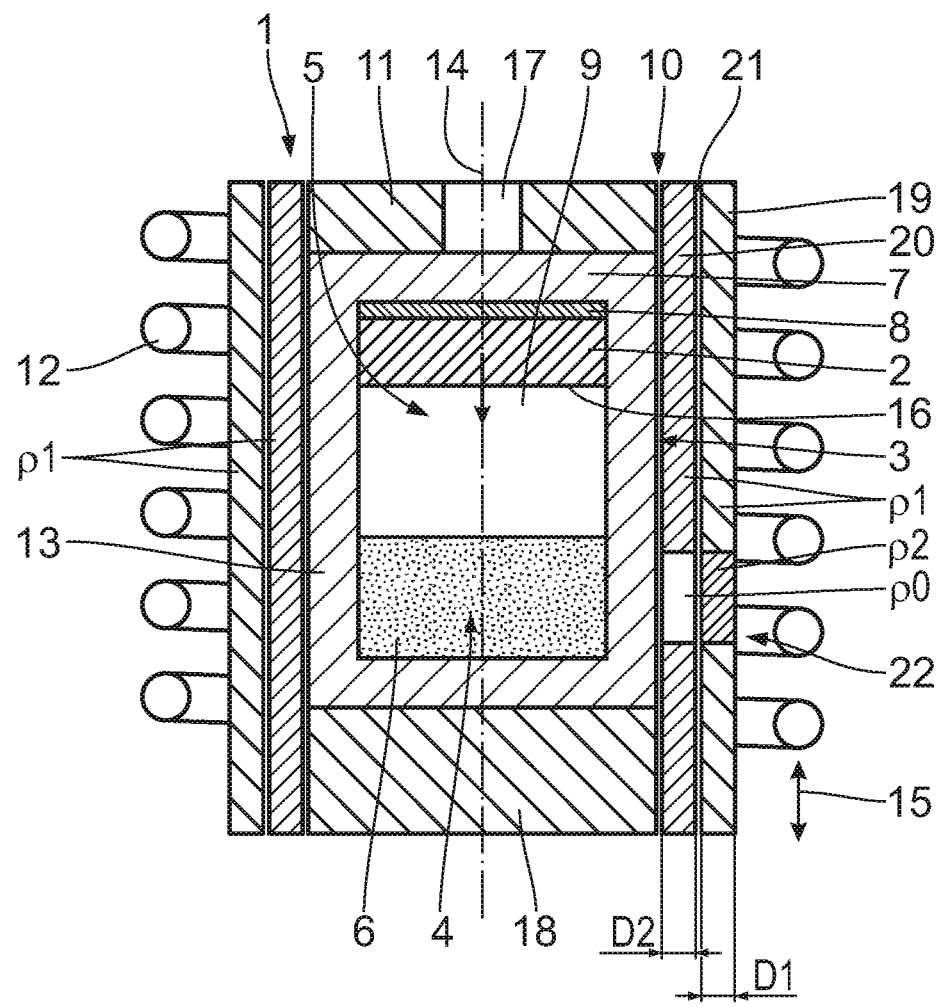
FIG. 1 is a longitudinal section through a working example of a growth arrangement with a thermal insulation having two insulation cylinder components during the sublimation growth of a bulk SiC single crystal.

Mutually corresponding parts are given the same reference numerals in FIGS. 1 to 5. Details of the working examples elucidated in detail hereinafter may constitute an invention on their own or be part of a subject of the invention.

Referring now to the figures of the drawing in detail and first, particularly, to FIG. 1 thereof, there is shown a working example of a growth arrangement 1 for the production of a bulk SiC single crystal 2 by means of sublimation growth. The growth arrangement 1 contains a growth crucible 3 comprising an SiC reservoir region 4 and a crystal growth region 5. In the SiC reservoir region 4 there is, for example, SiC source material 6 in pulverulent form, which is introduced as prefabricated starting material prior to commencement of the growing process into the SiC reservoir region 4 of the growth crucible 3.

In the region of a crucible end wall 7 of the growth crucible 3 opposite the SiC reservoir region 4, there is mounted an SiC seed crystal 8 that extends axially into the crystal growth region 5. The SiC seed crystal 8 is especially monocrystalline. The crucible end wall 7 may take the form of a crucible lid of the growth crucible 3. However, this is not obligatory. The bulk SiC single crystal 2 to be grown grows on the SiC seed crystal 8 by means of deposition from a SiC growth gas phase 9 that forms in the crystal growth region 5. The growing bulk SiC single crystal 2 and the SiC seed crystal 8 have roughly the same diameter. If any, a variance of not more than 20% by which a seed diameter of the SiC seed crystal 8 is smaller or greater than a single crystal diameter of the bulk SiC single crystal 2 arises. However, a gap (not shown in FIG. 1) may exist between the inside of a crucible side wall 13 on the one hand and the growing bulk SiC single crystal 2 and the SiC seed crystal 8 on the other hand.

In the working example according to FIG. 1, the growth crucible 3 consists of an electrically and thermally conductive graphite crucible material having a density of, for example, at least 1.75 g/cm³. Around it is disposed a thermal insulation 10 which, in the working example shown, is in multipart form. The insulation 10 is composed, for example, of carbon-based insulation material having long or short fibres. The insulation material has a material density which, in the working example shown, is about 0.2 g/cm³.

For heating of the growth crucible 3, an inductive heating device in the form of a heating coil 12 is arranged around the outside of the thermally insulated growth crucible 3. The growth crucible 3 is heated to the temperatures required for the growth by means of the heating coil 12. In the working example shown, these growth temperatures are at least 2100° C. The heating coil 12 inductively couples an electrical current into the electrically conductive crucible side wall 13 of the growth crucible 3. This electrical current flows essentially as a circular current in circumferential direction within the circularly cylindrical and hollow-cylindrical crucible side wall 13 and in so doing heats up the growth crucible 3. If required, the relative position between the heating coil 12 and the growth crucible 3 may be altered axially, i.e. in the direction of a middle longitudinal axis 14 of the growing bulk SiC single crystal 2, especially in order to adjust and optionally also to alter the temperature or temperature profile within the growth crucible 3. The position of the heating coil 12 which is variable axially during the growth process is indicated in FIG. 1 by the double-headed arrow 15. More particularly, the heating coil 12 is moved in accordance with the progress of growth of the growing bulk SiC single crystal 2. The movement is preferably downward, i.e. in the direction of the SiC source material 6, and preferably by the same length by which the bulk SiC single crystal 2 grows, for example by a total of about 20 mm. For this purpose, the growth arrangement 1 comprises monitoring, control and adjustment means of appropriate configuration that are not shown in detail.

The SiC growth gas phase 9 in the crystal growth region 5 is fed by the SiC source material 6. The SiC growth gas phase 9 contains at least gas constituents in the form of Si, $Si_2C$ and $SiC_2$ (=SiC gas species). The material transport of the SiC source material 6 to a growth interface 16 on the growing bulk SiC single crystal 2 firstly proceeds along an axial temperature gradient. At the growth interface 16 there is a relatively high growth temperature of at least 2100° C., especially even of at least 2200° C. or 2300° C. In addition, at the growth interface 16, in particular, an axial temperature gradient of at least 5 K/cm, preferably of at least 15 K/cm, is established in the direction of the middle longitudinal axis. The temperature within the growth crucible 3 decreases toward the growing bulk SiC single crystal 2. The highest temperature at about 2300° C. to 2500° C. is in the region of the SiC reservoir region 4. This temperature profile with a temperature differential of especially 100° C. to 150° C. between the SiC reservoir region 4 and the growth interface 16 can be achieved via various measures. For instance, by means of a division (not shown in detail) of the heating coil 12 into two or more axial subsections, it is possible to provide axial variation in heating. In addition, in the lower section of the growth crucible 3, for example by means of appropriate axial positioning of the heating coil 12, it is possible to establish a stronger heating effect than in the upper section of the growth crucible 3.

The thermal insulation 10 has an upper axial insulation lid 11, disposed adjacent to the upper crucible end wall 7 and containing a central cooling opening 17 disposed at the middle longitudinal axis 14. Heat can be removed via the cooling opening 17 and/or the growth crucible 3 can be monitored. In addition, thermal insulation 10 has a lower axial insulation lid 18, disposed below the SiC reservoir region 4, and two insulation cylinder components 19 and 20, in a concentric arrangement relative to the middle longitudinal axis 14 and also concentric relative to one another. The latter surround the crucible side wall 13. The insulation cylinder component 20 has been inserted into the insulation cylinder component 19 (see also FIGS. 2 and 3). The outer insulation cylinder component 19 has a wall thickness D1 measured in radial direction; the inner insulation cylinder component 20 has a wall thickness D2 likewise measured in radial direction. The thermal insulation 10, like the growth crucible 3 as well, has a rotationally symmetric construction based on the middle longitudinal axis 14. This is also especially true of the two insulation cylinder components 19, 20. The thermal insulation 10 extends axially in the direction of the central middle longitudinal axis 14.

Figure 2:
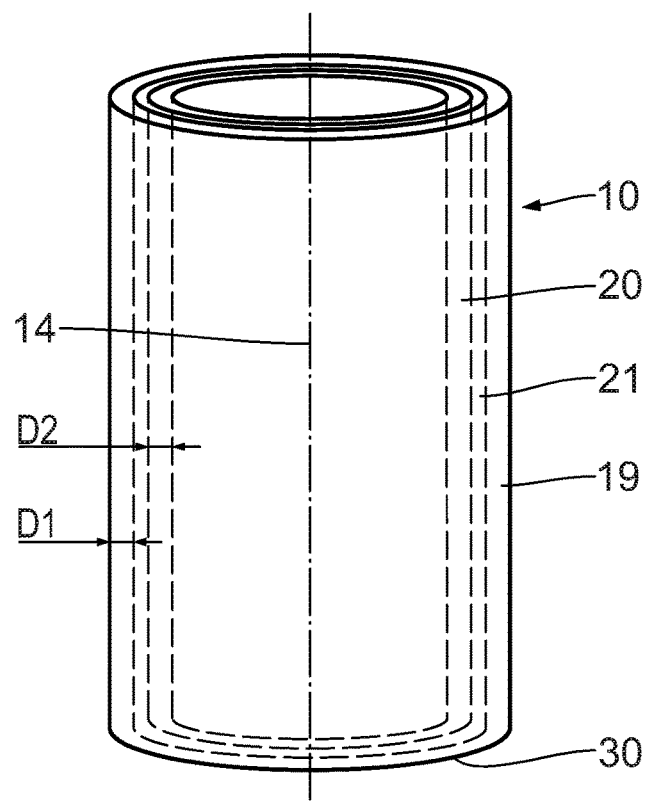
FIGS. 2 and 3 are perspective views of the two insulation cylinder components according to FIG. 1.
Figure 3:
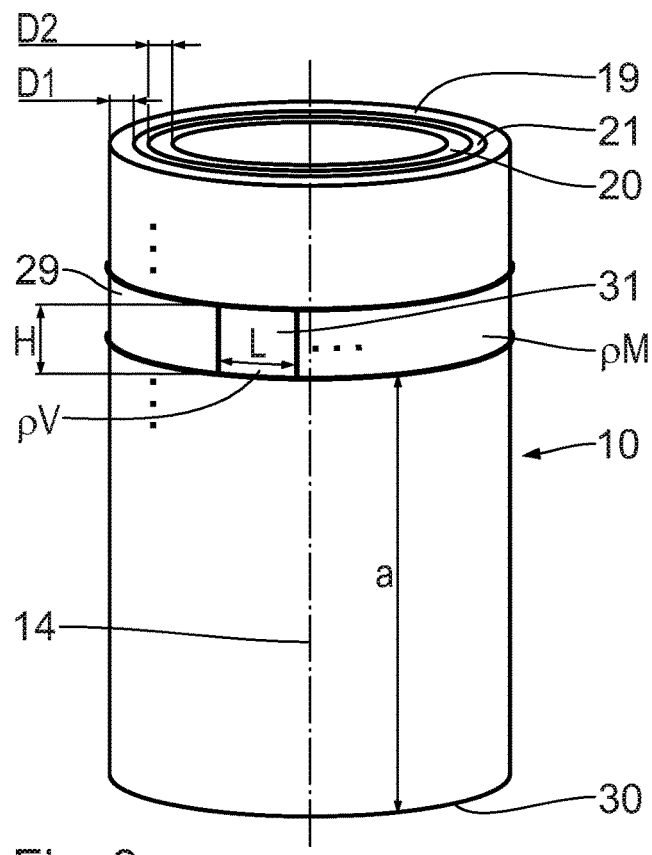
Figure 4:
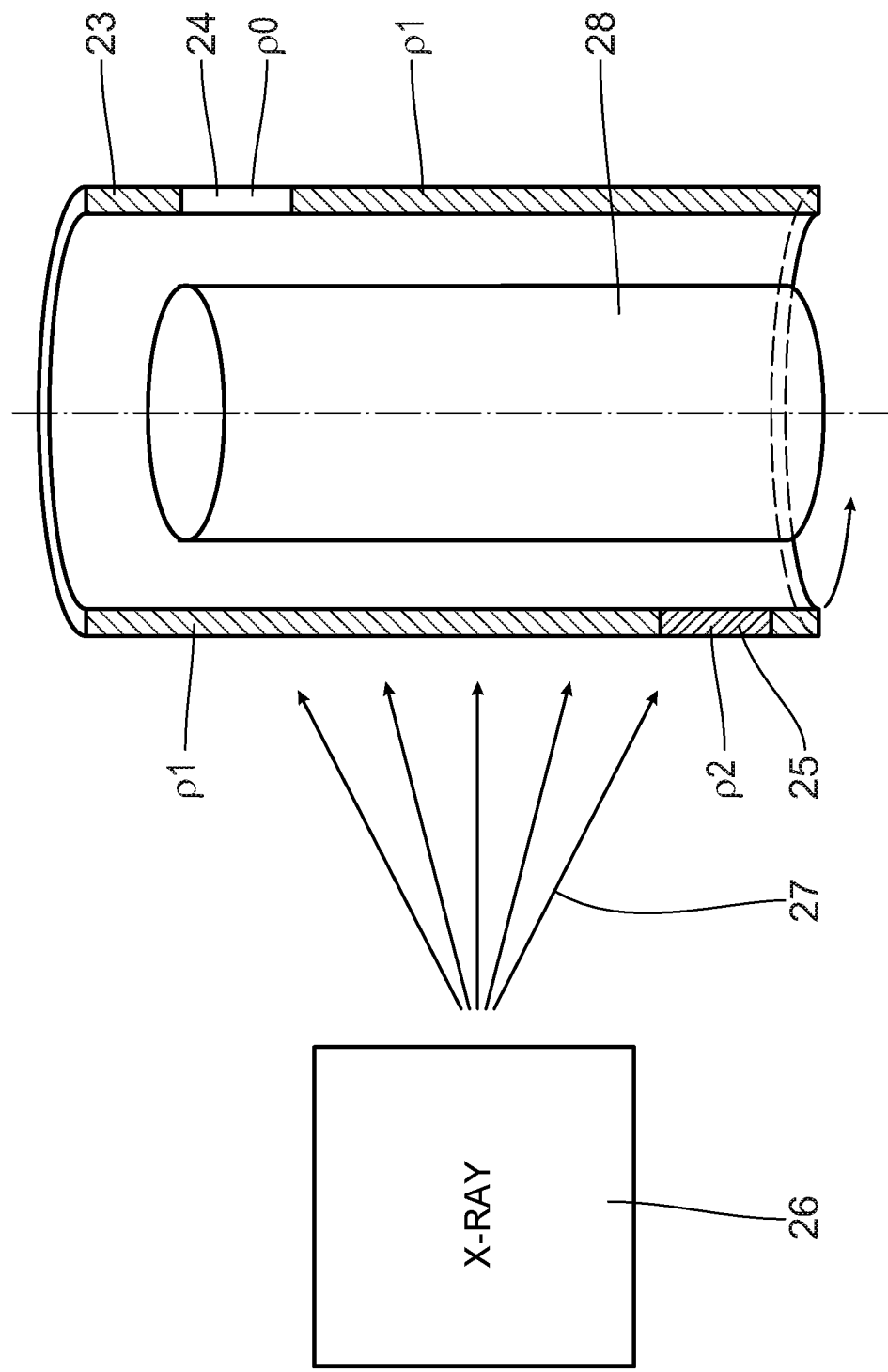
FIG. 4 is a diagrammatic and partly broken-away view of a working example of an analysis arrangement for x-ray analysis of an insulation cylinder component of a multipart thermal insulation.

In the partly transparent perspective view of FIG. 2, which is clearer in that respect, the two insulation cylinder components 19, 20 do not immediately adjoin one another. Instead, there is a spacing 21 between them with a radial extent in the range between 0.1 mm and 5 mm, especially between 1 mm and 2 mm. In the working example shown, the spacing 21 has a value of about 1 mm. The spacing 21 facilitates the inserting of the inner insulation cylinder component 20 into the outer insulation cylinder component 19 during assembly. In addition, it contributes to there being no crucial mechanical tensions between the two insulation cylinder components 19, 20 during the growing process.

The mechanical construction of the insulation cylinder components 19, 20 is rotationally symmetric in each case in terms of its construction. Nevertheless, this is not true of all material properties, especially not for the distribution of the material density in tangential direction. There can be variances here, such that the density distribution within the walls of the insulation cylinder components 19, 20 is not absolutely rotationally symmetric overall. FIG. 1 shows, by way of example, a variance site 22 in axial direction at the height of the SiC reservoir region 4 in both insulation cylinder components 19, 20. The local densities $\rho 0$ and $\rho 2$ vary there in the inner insulation cylinder component 20 or in the outer insulation cylinder component 19 from the base density $\rho 1$ that otherwise exists in both insulation cylinder components 19, 20. The local density $\rho 0$ of the inner insulation cylinder component 20 is smaller there, and the local density $\rho 2$ of the outer insulation cylinder component 19 is greater there, than the base density $\rho 1$. The following relationship is applicable: $\rho 0 < \rho 1 < \rho 2$. The two insulation cylinder components 19, 20 are specifically selected and positioned relative to one another such that the local variances in density very substantially balance out at the variance site 22, in order to have very substantially ideal rotational symmetry of the density distribution overall in the thermal insulation 10, viewed over the wall thicknesses D1 and D2 of the two insulation cylinder components 19, 20. In the case of a rotationally symmetric density distribution in the thermal insulation 10, a rotationally symmetric temperature field is established within the growth crucible 3, as a result of which the bulk SiC single crystal 2 likewise grows in a rotationally symmetric and hence very homogeneous and defect-free manner.

In order to be able to accomplish the described advantageous balancing of local variances in density in the thermal insulation 10, the distribution of the material density is first ascertained in the insulation cylinder components 19, 20 involved. As apparent from FIG. 4, this is effected by means of an x-ray method. What is shown is the analysis of another insulation cylinder component 23, the material density of which varies from the base density $\rho 1$ at two variance sites 24 and 25. The locally variant densities are in turn identified as $\rho 0$ and $\rho 2$. Outside the insulation cylinder component 23 to be analysed, there is an x-ray source 26, by means of which x-radiation 27 is radiated onto the insulation cylinder component 23. Within the insulation cylinder component 23 is positioned a detector 28 that detects the x-radiation 27 after it has passed through the wall of the insulation cylinder component 23. Using the x-radiation 27 received, it is then possible to conclude the material density of the insulation cylinder component 23 at the point traversed by the radiation. The insulation cylinder component 23 is analysed at every point in this way. For example, it is rotated for the purpose. At the end of the analysis, there is a complete description of the density distribution within the insulation cylinder component 23. More particularly, it is then known where there are local variances from the base density $\rho 1$ and how large these variances are.

Using this information, it is possible to select the insulation cylinder components 19, 20 to be used to construct the thermal insulation 10 and position them relative to one another such that local density variances are balanced. The selection/testing criterion used as the basis is elucidated in detail with reference to the figure of FIG. 3, using the example of the thermal insulation 10 with the two insulation cylinder components 19, 20 of the growth arrangement 1 according to FIG. 1.

For instance, the thermal insulation 10 with the two insulation cylinder components 19, 20 is notionally divided into multiple insulation ring segments in a successive axial arrangement in the direction of the central middle longitudinal axis 14. One of these, namely the insulation ring segment 29, is shown by way of example in the diagram of FIG. 3. Each of these insulation ring segments has a different axial distance a from an axial edge 30 of the thermal insulation 10. In the example according to FIG. 3, the edge 30 is the lower axial edge of the thermal insulation 10. Each of these insulation ring segments is in turn notionally divided into multiple volume elements arranged alongside one another in tangential direction. One of these, namely the volume element 31, is shown by way of example in the diagram according to FIG. 3. Each insulation ring segment, including the insulation ring segment 29, has an average insulation ring segment density $\rho M$ which is determined by averaging the local density values in all insulation cylinder components, here in the two insulation cylinder components 19, 20, in the region of the insulation ring segment in question. In the determination of the respective average insulation ring segment density $\rho M$, the density ratios within the walls of all insulation cylinder components are thus taken into account, each in the region of the insulation ring segment in question. Not taken into account, by contrast, are the ratios in the spacing 21 between the two insulation cylinder components 19, 20. The insulation cylinder components involved, here the insulation cylinder components 19, 20, are selected and positioned relative to one another in such a way that each volume element of the insulation ring segment in question, including the volume element 31 of the insulation ring segment 29, has a volume element density $\rho V$ varying by not more than 10%, preferably even by not more than 5%, from the average insulation ring segment density $\rho M$ of the insulation ring segment in question. This condition is applicable to all insulation ring segments. The local density values of the insulation cylinder components 19, 20 required for this test are known more particularly from the x-ray analysis according to FIG. 4 conducted beforehand.

The volume element 31 (like every other volume element of the insulation ring segment 29) extends in axial direction over an axial element length H equal to an axial segment length of the insulation ring segment 29. In addition, the volume element 31 extends in tangential direction over an outer tangential element length L and in radial direction over the addition of the radial wall thicknesses of all insulation cylinder components involved, i.e. over the wall thicknesses D1 and D2 of the insulation cylinder components 19, 20 here. The axial element length H and also the outer tangential element length L are each in the range between 10 mm and 50 mm, especially each 50 mm or each 20 mm. The wall thicknesses D1 and D2 are in the range between 5 mm and 50 mm, especially between 10 mm and 20 mm. They may, but need not necessarily, be the same. This is also true when more than the two insulation cylinder components 19, 20 should be present.

Taking account of the above selection/testing criterion, the two insulation cylinder components 19, 20 have been selected as suitable for the thermal insulation 10. The insulation cylinder components 19, 20 have then been assembled with suitable orientation with respect to one another, again taking account of the above selection/testing criterion. The thermal insulation 10 thus produced can then be subjected once again to an x-ray analysis according to FIG. 4, in order to verify whether the density distribution of the overall construction has adequate rotational symmetry.

Figure 5:
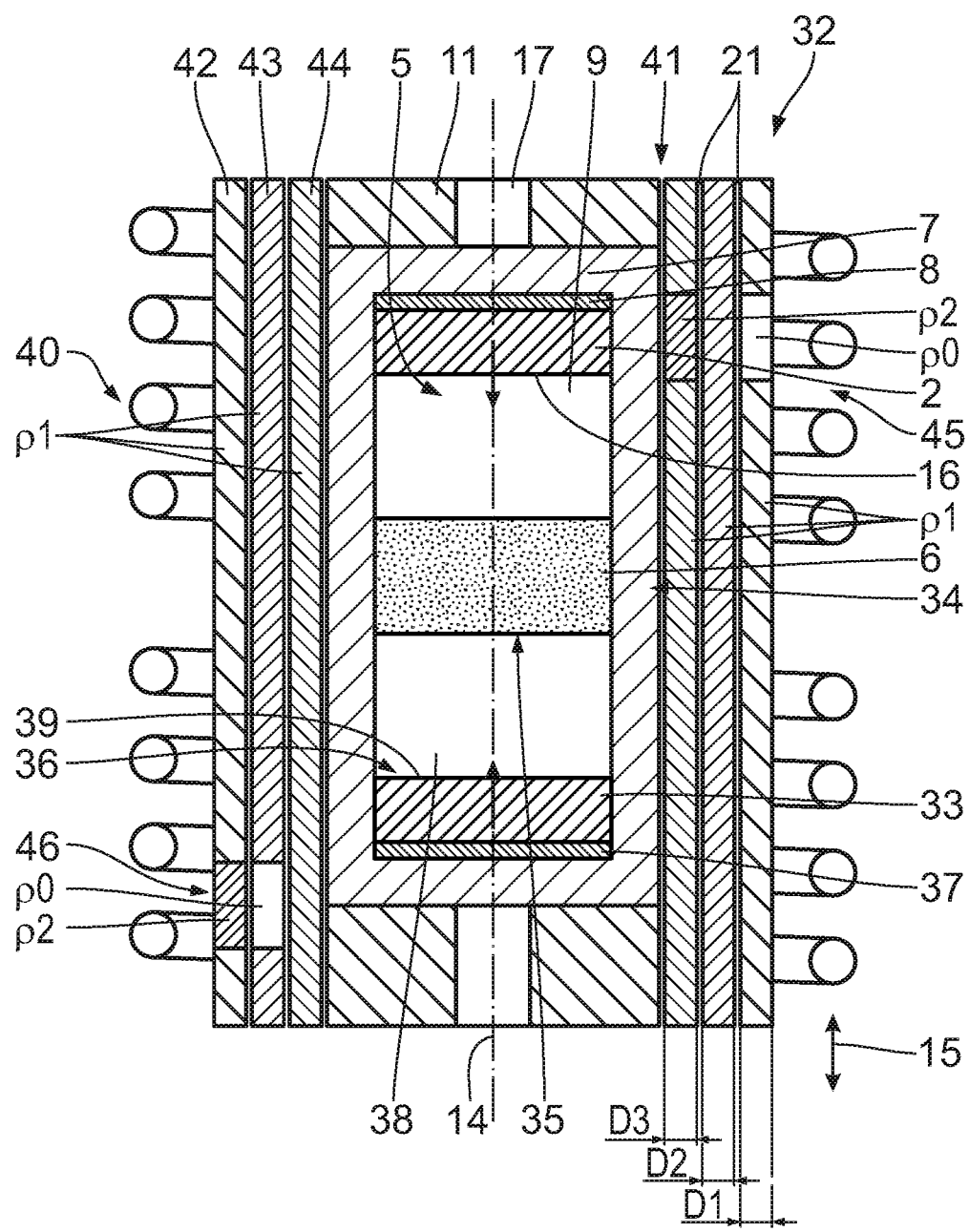
FIG. 5 is a longitudinal section view of a further working example of a growth arrangement with a thermal insulation having three insulation cylinder components during the sublimation growth of two bulk SiC single crystals.

FIG. 5 shows a further working example of a growth arrangement 32, implemented similarly to the growth arrangement 1. The growth arrangement 32 can produce a second bulk SiC single crystal 33 in parallel to the bulk SiC single crystal 2. For this purpose, the construction envisaged within the growth crucible 3 in the growth arrangement 1 is essentially duplicated by a mirror at the base of the growth crucible 3. The growth arrangement 32 accordingly contains a growth crucible 34 in which an SiC reservoir region 35 is disposed centrally not at the base but in the direction of the middle longitudinal axis 14. Above the SiC reservoir region 35 is the first crystal growth region 5, and below it a second crystal growth region 36. One of the two bulk SiC single crystals 2 and 33 grows in each of the two crystal growth regions 5 and 36. A second SiC seed crystal 37 is disposed at the base of the growth crucible 34, and the second bulk SiC single crystal 33 grows thereon from an SiC growth gas phase 38 that forms in the crystal growth region 36 and is fed by the SiC source material 6 present in the SiC reservoir region 35. At the same time, a growth interface 39 of the second bulk SiC single crystal 33 moves in the direction of a growth direction oriented parallel to the middle longitudinal axis 14, but opposite to the growth direction of the first bulk SiC single crystal 2. The middle longitudinal axis 14 is applicable, especially equally, to the two bulk SiC single crystals 2, 33. In that respect, the middle longitudinal axis 14 is preferably a common axis of the two bulk SiC single crystals 2, 33.

Overall, the growth crucible 34 has a construction which is mirror-imaged or symmetric in the direction of the middle longitudinal axis 14 in a transverse plane (not included in FIG. 5) which is arranged in the middle in the direction of the middle longitudinal axis 14 within the SiC reservoir region 35 and runs transverse to the middle longitudinal axis 14. The growth crucible 34 is rotationally symmetric with respect to the middle longitudinal axis 14. For heating of the growth crucible, a multipart heating coil 40 is provided.

A further difference from the growth arrangement 1 according to FIG. 1 is that the growth arrangement 32 has a thermal insulation 41 with three insulation cylinder components 42, 43, 44 in a concentric arrangement with respect to the middle longitudinal axis 14 and with respect to one another. The inner insulation cylinder component 44 has been inserted into the middle insulation cylinder component 43, which has in turn been inserted into the outer insulation cylinder component 42. The outer insulation cylinder component 42 has a radial wall thickness D1, the middle insulation cylinder component 43 a radial wall thickness D2, and the inner insulation cylinder component 44 a radial wall thickness D3. A spacing 21 is present in each case between adjacent insulation cylinder components 42, 43, 44. The thermal insulation 41 also has a rotationally symmetric construction, which is in turn especially also applicable to the three insulation cylinder components 42, 43, 44.

However, the insulation cylinder components 42, 43, 44 do not have perfect rotational symmetry in all material properties. Variances occur especially in the case of the density distribution. For instance, there are two variance sites 45 and 46. The first variance site 45 is at the height of the first crystal growth region 5. The local density $\rho 0$ in the outer insulation cylinder component 42 and the local density $\rho 2$ in the inner insulation cylinder component 44 vary there from the base density $\rho 1$ that otherwise exists in the three insulation cylinder components 42, 43, 44. The second variance site 46 is at the height of the second SiC seed crystal 37. The local density $\rho 0$ in the middle insulation cylinder component 43 and the local density $\rho 2$ in the outer insulation cylinder component 42 vary there from the base density $\rho 1$. Again, the following relationship is applicable in each case: $\rho 0 < \rho 1 < \rho 2$. In the case of the growth arrangement 32 as well, the three insulation cylinder components 42, 43, 44 are specifically selected and positioned relative to one another using the above-elucidated selection/testing criterion in such a way that the local density variances at the variance sites 45 and 46 very substantially balance out. For instance, the thermal insulation 41 overall has a largely ideally rotationally symmetric density distribution viewed over the wall thicknesses D1, D2 and D3 of the three insulation cylinder components 42, 43, 44. In this respect, a rotationally symmetric temperature field is also established within the growth crucible 34, by means of which the two bulk SiC single crystals 2 and 33 grow in a rotationally symmetric and hence very homogeneous and defect-free manner.

In principle, the use of the thermal insulation 41 with the three insulation cylinder components 42, 43, 44 is not limited to the growth arrangement 32 according to FIG. 5 for growth of two bulk SiC single crystals 2, 33. Three (or else more) insulation cylinder components may also be used in the case of other growth arrangements, for example in the case of the growth arrangement 1 according to FIG. 1. The aim here is in each case that the thermal insulation constructed with these insulation cylinder components has an overall density distribution with maximum perfection of rotational symmetry, in order in this way to promote rotationally symmetric growth of the bulk SiC single crystals to be produced.

In this respect, the growth arrangements 1 and 32 enable the production of high-quality bulk SiC single crystals 2, 33 that can be processed further with high yield to give components.

More particularly, it is possible to produce bulk SiC single crystals 2, 33, in each of which the maximum and minimum difference in length between crystal surface and the reverse side of the crystal at the crystal edge vary by not more than 10% from the measured average crystal length of the crystal edge. At the processing outline defined by the processing diameter, which is equal to the substrate diameter of the monocrystalline SiC substrates (=SiC wafers) obtained at a later stage from the bulk SiC single crystals 2, 33, the maximum and minimum difference in length between the crystal surface and the reverse side of the crystal of the bulk SiC single crystals vary by a maximum of 5% from the average crystal length measured at the processing outline. More particularly, the bulk SiC single crystals 2, 33 produced have essentially just a single SiC polytype, for example 4H—SiC, 6H—SiC, 3C—SiC or 15R—SiC. Preference is given to 4H—SiC. In addition, the crystal structure of the bulk SiC single crystals 2, 33 may have a slightly tilted orientation (=off orientation), where the tilt angle is in the range between 0° and 8°, preferably 4°. The bulk SiC single crystals 2, 33 have a crystal diameter of especially at least 100 mm, preferably of at least 150 mm. An upper limit in the crystal diameter is especially 250 mm. A preferred crystal diameter is 150 mm. In addition, the bulk SiC single crystals 2, 33 especially have a specific electrical resistivity in the range between $12 \cdot 10^{-3}$ Ωcm and $26 \cdot 10^{-3}$ Ωcm, preferably in the range between $16 \cdot 10^{-3}$ Ωcm and $24 \cdot 10^{-3}$ Ωcm.

The invention claimed is:

1. A method of producing a bulk SiC single crystal by sublimation growth, the method comprising:
   a) prior to a commencement of a growing process, placing at least one SiC seed crystal in a crystal growth region of a growth crucible, and introducing SiC source material into a SiC reservoir region of the growth crucible,
   b) during the growing process, generating an SiC growth gas phase in the crystal growth region by sublimation of the SiC source material and by transporting sublimed gaseous components into the crystal growth region, and growing the bulk SiC single crystal having a central middle longitudinal axis onto the SiC seed crystal by deposition from an SiC growth gas phase;

wherein:
- c) the growth crucible, prior to commencement of the growing process, is surrounded by an insulation that extends in a rotationally symmetric manner and axially in a direction of a central middle longitudinal axis and that has at least two insulation cylinder components; and wherein:
  - c1) the at least two insulation cylinder components are in a mutually concentric arrangement with one inside another, and each of the at least two insulation cylinder components has a wall thickness measured in a radial direction;
  - c2) the insulation is notionally divided into multiple insulation ring segments arranged successively and axially in the direction of the central middle longitudinal axis;
  - c3) each of the insulation ring segments is in turn notionally divided into multiple volume elements arranged alongside one another in a tangential direction;
  - c4) each of the insulation ring segments has an average insulation ring segment density measured over respective wall thicknesses of all of the at least two insulation cylinder components; and
  - c5) the at least two insulation cylinder components, each of which have variances in density in sub-regions, are selected and positioned relative to one another in such a way that every volume element of the insulation ring segment in question has a volume element density varying by not more than 10% from the average insulation ring segment density of the insulation ring segment in question; and
  - c6) every volume element extends in axial direction over an axial element length which is equal to an axial segment length of the insulation ring segment and is up to 50 mm, in circumferential direction over an outer tangential element length of up to 50 mm, and in radial direction over a sum of all wall thicknesses of the at least two insulation cylinder components.

2. The method according to claim 1, which comprises choosing an insulation material having a material density between 0.05 g/cm³ and 0.5 g/cm³ for the insulation.

3. The method according to claim 2, which comprises choosing an insulation material having a material density between 0.1 g/cm³ and 0.2 g/cm³ for the insulation.

4. The method according to claim 1, which comprises, prior to the commencement of the growing process, determining a density by way of an x-ray method of the at least two insulation cylinder components.

5. The method according to claim 1, which comprises selecting the at least two insulation cylinder components and positioning the at least two insulation cylinder components relative to one another such that every volume element of the insulation ring segment in question has a volume element density varying by no more than 5% from the average insulation ring segment density of the insulation ring segment in question.

6. The method according to claim 1, which comprises choosing the respective insulation ring segment and the volume elements of the insulation ring segment such that the axial element length of the volume elements is 20 mm and the outer tangential element length of the volume elements is 20 mm.

7. The method according to claim 1, wherein the radial wall thickness of the at least two insulation cylinder components in each case lies in a range between 5 mm and 50 mm.

8. The method according to claim 7, wherein the radial wall thickness of the at least two insulation cylinder components in each case lies in a range between 10 mm and 20 mm.

9. The method according to claim 1, wherein a quotient of two of the radial wall thicknesses of the at least two insulation cylinder components lies in a range between 0.5 and 2.

10. The method according to claim 1, which comprises constructing the insulation in such a way that two mutually adjacent insulation cylinder components of the at least two insulation cylinder components are radially separated by a distance in a range between 0.1 mm and 5 mm.

11. The method according to claim 10, wherein the at least two insulation cylinder components are separated by a distance between 1 mm and 2 mm.

12. A growth arrangement for producing at least one bulk SiC single crystal by sublimation growth, the growth arrangement comprising:
- a) a growth crucible having a crystal growth region for accommodating an SiC seed crystal and an SiC reservoir region for accommodating SiC source material; and
- b) a heating device for heating the growth crucible, to cause, during growth, a sublimation of the SiC source material, a transport of sublimed gaseous components into the crystal growth region, and a generation of an SiC growth gas phase thereon, and as a result to cause the at least one bulk SiC single crystal having a central middle longitudinal axis to grow onto the at least one SiC seed crystal by deposition from the SiC growth gas phase;
- c) an insulation surrounding the growth crucible, said insulation extending rotationally symmetrically and axially in a direction of the central middle longitudinal axis and having at least two insulation cylinder components, and wherein:
  - c1) the at least two insulation cylinder components are in a mutually concentric arrangement with one inside another, and each of the at least two insulation cylinder components has a wall thickness measured in a radial direction;
  - c2) the insulation is notionally divided into multiple insulation ring segments arranged successively and axially in the direction of the central middle longitudinal axis;
  - c3) each of the insulation ring segments is in turn notionally divided into multiple volume elements arranged alongside one another in a tangential direction;
  - c4) each of the insulation ring segments has an average insulation ring segment density measured over the wall thicknesses of all of the at least two insulation cylinder components;
  - c5) the at least two insulation cylinder components, each of which have variances in density in sub-regions, are selected and positioned relative to one another in such a way that every volume element of the insulation ring segment in question has a volume element density varying by no more than 10% from the average insulation ring segment density of the insulation ring segment in question; and c6) every volume element extends in axial direction over an axial element length that is equal to an axial segment length of the insulation ring segment and is up to 50 mm, in circumferential direction over an outer tangential element length of up to 50 mm, and in radial direction over a sum of all wall thicknesses of the at least two insulation cylinder components.

13. The growth arrangement according to claim 12, wherein the insulation comprises an insulation material having a material density between 0.05 g/cm$^3$ and 0.5 g/cm$^3$.

14. The growth arrangement according to claim 13, wherein the insulation comprises an insulation material having a material density between 0.1 g/cm$^3$ and 0.2 g/cm$^3$.

15. The growth arrangement according to claim 12, wherein the at least two insulation cylinder components are selected and positioned relative to one another such that every volume element of the insulation ring segment in question has a volume element density varying by no more than 5% from the average insulation ring segment density of the insulation ring segment in question.

16. The growth arrangement according to claim 12, wherein the axial element length of the volume elements is 20 mm and the outer tangential element length of the volume elements is 20 mm.

17. The growth arrangement according to claim 12, wherein the radial wall thickness of each of the at least two insulation cylinder components lies in a range between 5 mm and 50 mm.

18. The growth arrangement according to claim 17, wherein the radial wall thickness of each of the at least two insulation cylinder components lies in a range between 10 mm and 20 mm.

19. The growth arrangement according to claim 12, wherein a quotient of two of the radial wall thicknesses of the at least two insulation cylinder components lies in a range between 0.5 and 2.

20. The growth arrangement according to claim 12, wherein two mutually adjacent insulation cylinder components among the at least two insulation cylinder components each are radially separated by a distance in a range between 0.1 mm and 5 mm.

21. The growth arrangement according to claim 20, wherein each of the at least two insulation cylinder components has a radial separation in the range between 1 mm and 2 mm.

\* \* \* \* \*